United States Patent [19]

Tanimoto et al.

[11] Patent Number: 4,870,452
[45] Date of Patent: Sep. 26, 1989

[54] PROJECTION EXPOSURE APPARATUS

[75] Inventors: Akikazu Tanimoto, Yokohama; Issei Tanaka, Kawasaki; Akira Miyaji, Tokyo, all of Japan

[73] Assignee: Nikon Corporation, Tokyo, Japan

[21] Appl. No.: 214,543

[22] Filed: Jul. 1, 1988

[30] Foreign Application Priority Data

Jul. 8, 1987 [JP] Japan .................. 62-170723

[51] Int. Cl.$^4$ .............................. G03B 27/42
[52] U.S. Cl. ........................ 355/53; 355/43; 356/400; 356/349
[58] Field of Search ............................ 355/43, 53, 67; 356/400, 401, 152, 373, 375, 237, 338, 349; 250/548, 204, 572, 563

[56] References Cited

U.S. PATENT DOCUMENTS

| 4,541,715 | 9/1985 | Akiyama et al. ................ 355/53 X |
| 4,650,983 | 3/1987 | Suwa .................... 250/204 |
| 4,668,077 | 5/1987 | Tanaka .................... 355/43 X |
| 4,677,301 | 6/1987 | Tanimoto et al. .................. 250/548 |
| 4,681,430 | 7/1987 | Goel et al. ....................... 355/53 X |
| 4,687,322 | 8/1987 | Tanimoto et al. ................ 355/43 X |
| 4,704,020 | 11/1987 | Murakami et al. ............... 355/53 X |
| 4,710,026 | 12/1987 | Magome et al. .................... 356/349 |
| 4,801,977 | 1/1989 | Ishizaka et al. ................... 355/53 X |
| 4,814,829 | 3/1989 | Kosugi et al. ........................ 355/43 |

Primary Examiner—Richard A. Wintercorn
Attorney, Agent, or Firm—Shapiro and Shapiro

[57] ABSTRACT

A projection exposure apparatus is provided with an optical member, capable of transmitting the exposure light of a first wavelength, placed between a projection optical system and a wafer. The alignment light of a second wavelength for pattern detection is introduced obliquely to the wafer surface through the optical member. A pattern in the projection exposure area or in the vicinity thereof, particularly an alignment mark can be detected by means of the reflection and transmission characteristics.

6 Claims, 4 Drawing Sheets

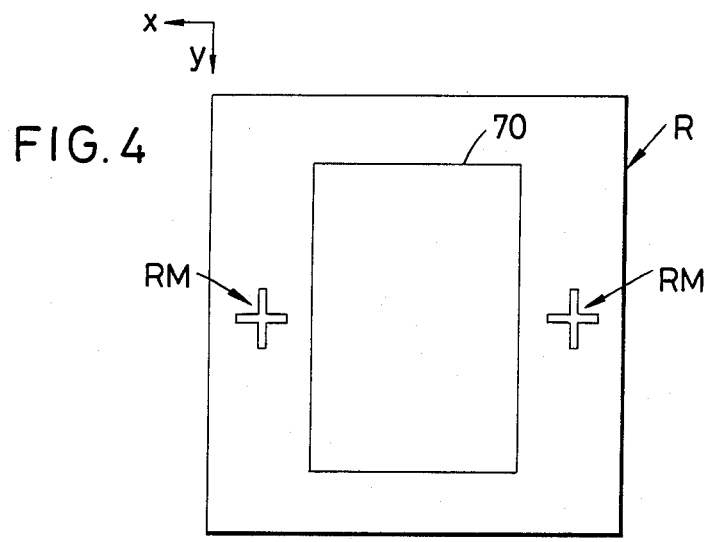
FIG. 4
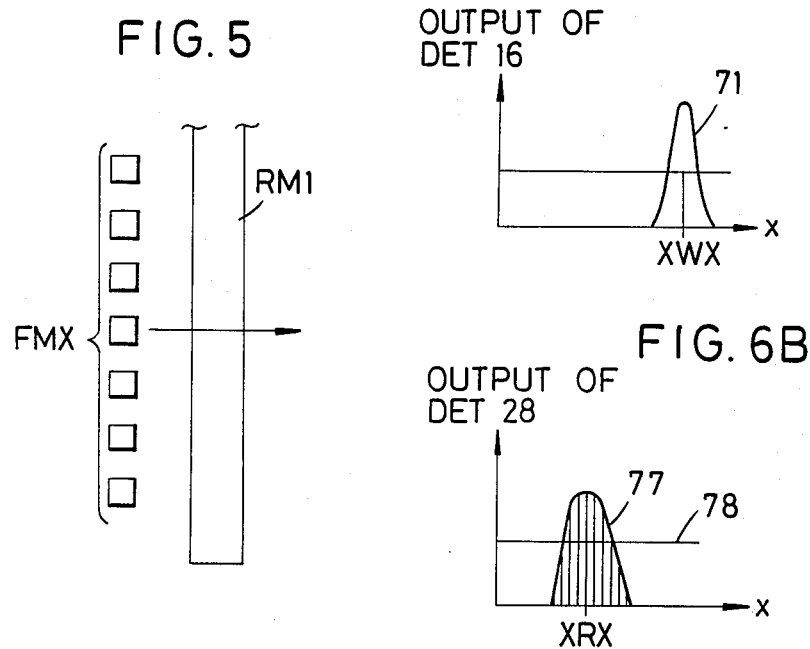
FIG. 5
FIG. 6A
FIG. 6B

PROJECTION EXPOSURE APPARATUS

BACKGROUND OF THE INVENTION

1. Field of the Invention

The present invention relates to a projection exposure apparatus for use in the micropattern transfer in a lithographic process in the manufacture of large-scale integrated circuits or the like.

2. Related Background Art

For pattern transfer of the most-advanced large-scale integrated circuits there have widely been employed reduction projection exposure apparatus or steppers utilizing g-line spectrum (wavelength 436 nm) of ultra-high pressure mercury vapor lamps, but steppers utilizing an excimer laser employing XeCl, KrF, ArF etc. as the light source are being contemplated for achieving finer pattern transfer with a high throughput in the future. The projection lens system for imaging with the light of the excimer laser can be a wide-band lens which is color corrected for the light of a wide spectral range (for example about 0.4 nm) obtained by spontaneous oscillation or the excimer laser, or a narrow-band lens matching the light of excimer laser of a spectral range of 0.01 nm or smaller. The wide-band lens is composed of quartz and fluorite, and is free from speckles because there can be employed excimer laser light of a wide spectrum range and low coherency. Also the through-the-lens (TTL) alignment will be possible since it can be corrected in aberration for the wavelength not actinit to the photoresist. It is, however, difficult, with the present lens manufacturing technology, to obtain a lens having a transfer area of a diameter of 22 mm or larger and having a numerical aperture (N.A.) of 0.35 or larger, which is largely required for the mass production of large-scale integrated circuits.

On the other hand, the narrow-band lens is entirely composed of quartz, and can be satisfactorily produced with the most advanced manufacturing technology available presently. Consequently the lens of this type is expected for early commercialization.

In such narrow-band lens, there has not been available suitable technology for through-the-lens alignment, even if a resolution of $0.5\mu$ or smaller is obtained in an area of a diameter of about 22 mm. This is firstly because the patterns on the wafer cannot be observed with a high resolution, as such narrow-band lens is anachromatized only for the spectrum of the excimer laser light for exposure so that the aberrations are not corrected for alignment with the non-actinic light. Secondly, even if the excimer laser light for exposure is used for illumination for the alignment, the wafer surface cannot be observed through the photoresist as such phtoresist generally has strong absorption.

SUMMARY OF THE INVENTION

The object of the present invention is to provide a projection exposure apparatus allowing observation of the patterns on the wafer with a high resolution by means of alignment light of a wavelength different from that of the exposure light.

The above-mentioned object can be achieved according to the present invention by placing an optical member, capable of transmitting the exposure light of a first wavelength, between a projection optical system and the wafer, and introducing the alignment light of a second wavelength for pattern detection obliquely to the wafer surface through said optical member, thereby enabling to detect a pattern in the projection exposure area or in the vicinity thereof, particularly an alignment mark, by means of the reflection and transmission characteristics.

According to the present invention, the optical member shows a higher transmittance to the light of the first wavelength because of the smaller incident angle, but shows a higher reflectance to the light of the second wavelength because of the larger incident angle. It is therefore possible to introduce the aligning light to the exposure area or to the vicinity thereof and to detect the aligning light from outside the projection optical system, so that the distance (baseline) between the exposure area and the alignment mark detecting system can be decreased.

BRIEF DESCRIPTION OF THE DRAWINGS

FIG. 4 is a plan view of a reticle;

FIG. 5 is a view showing the positional relationship of a reticle mark image when scanned with a fiducial mark;

FIGS. 6A and 6B are wave form charts showing the outputs of a photoelectric detector;

DESCRIPTION OF THE PREFERRED EMBODIMENTS

Figure 1:
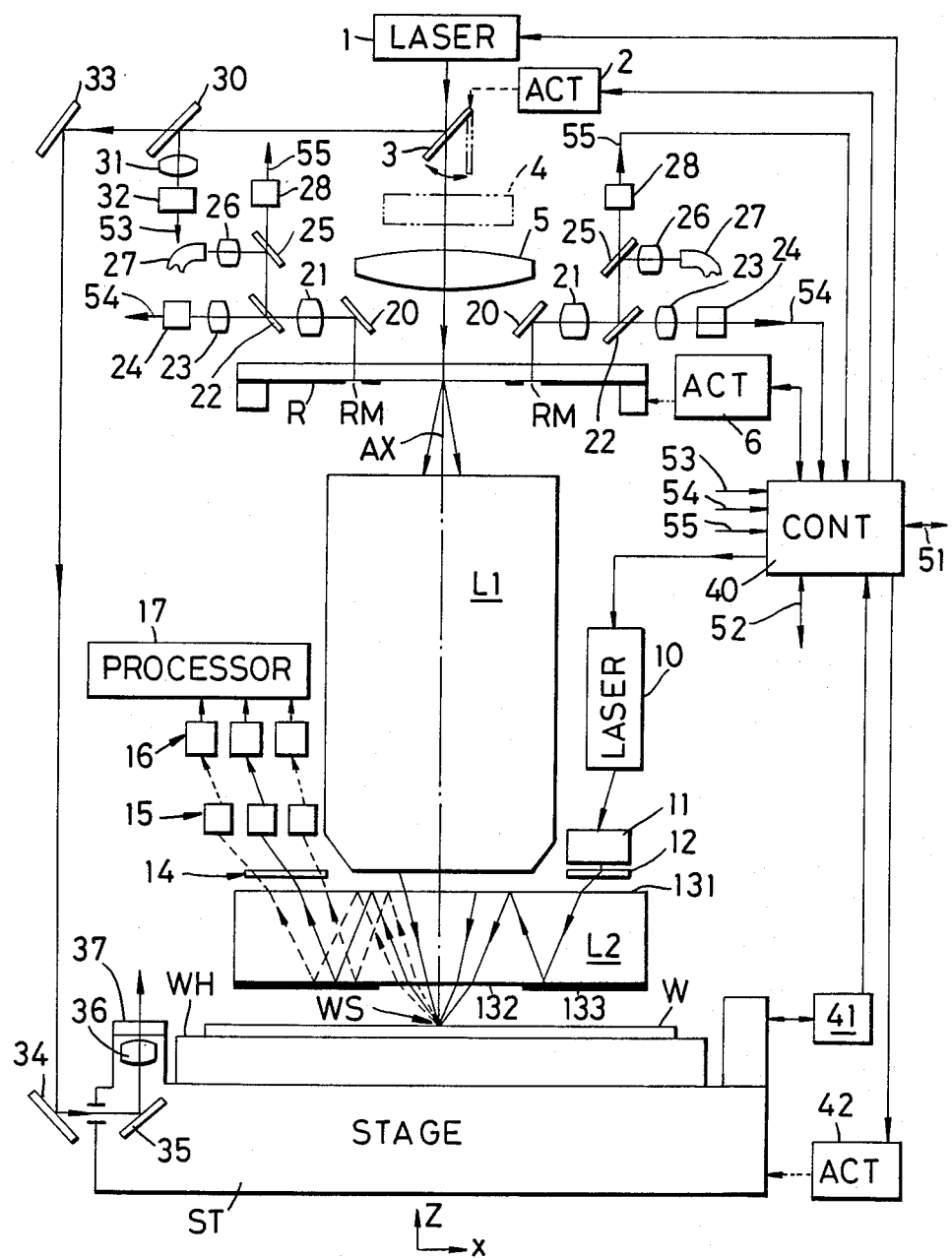
FIG. 1 is a schematic view of the structure of an embodiment of the present invention.

FIG. 1 principally shows optical systems and signal processing system particularly related to the present invention. The light of a wavelength of 248 nm (first wavelength) emitted from an excimer laser 1 is directed to a switching mirror 3 set in vibrating motion by an actuator 2. An exposure control unit 4 illuminates a reticle R with uniform intensity in cooperation with a condenser lens 5, and controls the illuminated area on the reticle R and the amount of light directed thereto, by means for example of a field diaphragm.

A projection optical system composed of a projection lens L1 and a flat optical member L2 projects the pattern, formed on the bottom surface of the reticle, onto a photosensitive layer formed on the wafer W.

For the purpose of alignment there is provided a He-Ne laser 10 emitting the light of a wavelength of 633 nm (second wavelength). The beam of said He-Ne laser is guided through a condensing optical system 11 including for example a cylindrical lens, a filter 12 for eliminating the actinic wavelength range for the photoresist on the wafer and the optical member L2, and obliquely enters the wafer W, thus forming an oblong slit-shaped laser spot WS. The incident angle of said laser beam onto the wafer should not, preferably, be excessively large.

The optical member L2 is preferably composed of synthetic quartz which is transparent to the light of the second wavelength and the visible light, and has a uniform refractive index as that of the projection lens L1 to the light of the first wavelength. The optical member L2 is provided, on the upper face 131 thereof, with a thin film coating which prevents reflection of the light of the first wavelength entering the upper face 131 with an incident angle contributing to the image projection and shows nearly equal reflectance and transmittance for the light of the second wavelength entering obliquely. Also the optical member L2 is provided, in an area 132 for transmitting the exposing light on the lower face, with a coating preventing the reflection for the first and second wavelengths over a wide angular range. In an external area 133 not transmitting the exposing light, there is provided a mirror coating showing a high reflectance for the light of the second wavelength.

The aligning light obliquely introduced into the optical member L2 is reflected by the lower face 133 and the upper face 131, then transmitted by the lower face 132 and concentrated as a laser spot WS on the wafer W. In the present embodiment, the wafer is provided thereon with an alignment mark shaped like a diffraction grating, composed of a regular array of elements. The light diffracted by said mark obliquely enters the lower face 132 of the optical member L2, then reflected by the upper face 131 and the lower face 133, and transmitted by a filter 14 for eliminating the first wavelength. It is then collected into three optical systems 15 according to the order of diffraction (0th order, ±1st order and ±2nd order), then respectively received by detectors 16 such as photomultipliers, and the photoelectrically converted signals from said detectors 16 are processed by a signal processing system 17.

The above-mentioned filters 12, 14 are provided for preventing the scattered or stray light of the exposing light from entering the aligning optical system, and for preventing eventual solarization phenomenon in the ordinary glass caused by ultraviolet light.

A wafer holder WH, supporting the wafer W, is formed in known manner, rotatable in the horizontal plane and movable in the z-direction (axial direction) on a wafer stage ST, which is movable in the x-y directions with an actuator 42, and the movement thereof is measured with a laser interferometer 41. In the drawing there are only shown the actuator 42 and the interferometer 41 for the x-direction, but similar devices are provided also for the y-direction.

In addition to the aligning optical system 10, 11, 12, 14, 15 and the detector 16 for measuring the alignment mark in the y-direction explained above, there is provided another set for measurement in the x-direction at a position of 90° about the optical axis AX of the projection lens, and the output signals from said another set is processed commonly by the processing system 17. In the present embodiment, the slit-shaped light spot for the x-direction and that for the y-direction are so formed as to perpendicularly cross on the optical axis AX. The aligning laser beam enters the wafer obliquely with respect to the longitudinal direction of the slit-shaped light spot, and the grating elements of the alignment mark are formed with a regular pitch along the longitudinal direction of said slit-shaped light spot.

The output signals from the detectors are selectively processed in the processing system 17 and sent to a central processing unit. In the present embodiment, the detecting system for the alignment mark employs a method of moving the wafer stage ST with respect to the stationary light spot WS and measuring the output of the laser interferometer 41 in synchronization with the output of the detector 16, as disclosed in the U.S. Pat. No. 4,677,301.

On the other hand, the reticle R is fixed by vacuum suction to a reticle stage RS, and is rendered movable in directions x, y, θ by an actuator 6. Paired reticle marks marks RM, for aligning the reticle R with respect to the apparatus are formed inside the projection area of the reticle, and are positioned symmetrically on both sides of the projection area of the circuit pattern. The position of each reticle mark RM is measured in the following manner.

Light from another external light source such as halogen lamp or mercury lamp is guided through light guides 27, further guided through condenser lenses 26, dichroic mirrors 25, beam splitters 22, objective lenses 21 and mirror 20, and illuminates the reticle marks RM. The light reflected by each reticle RM is guided through the objective lens 21 and an image lens 23 to form the image of the reticle mark RM on a scanning detector 24, thereby detecting the position of the reticle mark RM. Said scanning detector 24 can be composed for example of a sliding slit photoelectric microscope, a photodiode array or a television camera. Also in the above-mentioned detecting system for reticle alignment, the mirror 20, objective lens 21, beam splitter 22 and dichroic mirror 25 can transmit the light of the first wavelength, thereby guiding the exposing light, transmitted through the reticle mark RM from the projection lens, toward a detector 28 which is matched with the light of the first wavelength.

FIG. 4 shows an example of the form of the paired reticle marks RM. The outside of the pattern area 70 is shielded by low-reflecting chromium, in which a pair of cross-formed translucent marks RM are formed. On the wafer stage ST there is provided a reference mark plate 37 having a translucent fiducial mark. The surface of said mark plate 37 is at the approximately same level as that of the wafer. With the switching mirror 3 at the illustrated position, the light of the excimer laser is introduced through a beam splitter 30, and mirrors 33, 34, 35 into the interior of the wafer stage ST and illuminates the mark plate 37 from the bottom side through a lens 36. By moving the wafer stage ST so as to bring the translucent fiducial mark of the mark plate 37 to the image position of the reticle mark RMA or RMB, the light from said fiducial mark can be received by the detector 28.

Though not shown in FIG. 1, a sensor for detecting the height of the surface of the wafer is provided for automatic focusing.

Figure 2:
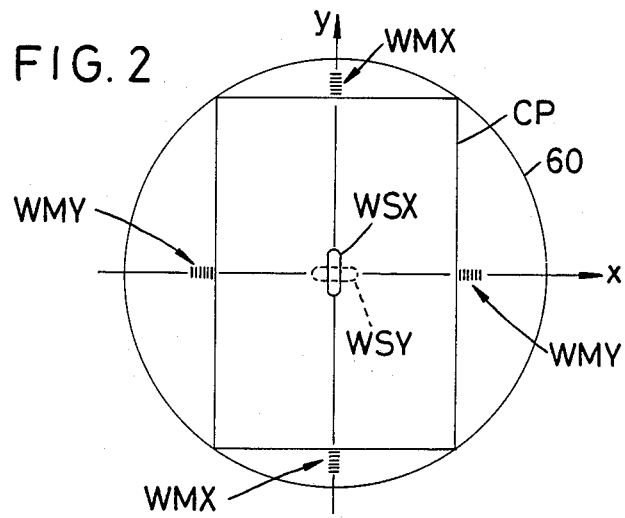
FIG. 2 is a schematic view of a beam spot for alignment and alignment marks on the wafer.

FIG. 2 shows, in a state where the alignment is achieved, the positional relationship of the exposure area 60 of the projection optical system, two pairs of wafer alignment marks WMX, WMY and a circuit pattern exposure area CP formed on the wafer W, and the light spot WSX for mark detection in the x-direction, and the light spot WSY for mark detection in the y-direction. Said light spots WSX, WSY are alternately formed on the wafer W at the center of the projection exposure area 60 (approximately corresponding to the optical axis AX), and the center of measurement of the laser interferometer 41 is so positioned as to coincide with the center of the projection exposure area 60. When the center of measurement of the laser interferometer is made to coincide with the x- and y-axes in FIG. 2, the marks WMX are positioned on the y-axis around the area CP, while the marks WMY are similarly positioned on the x-axis. Each mark is composed of a known diffraction grating pattern.

Figure 3A:
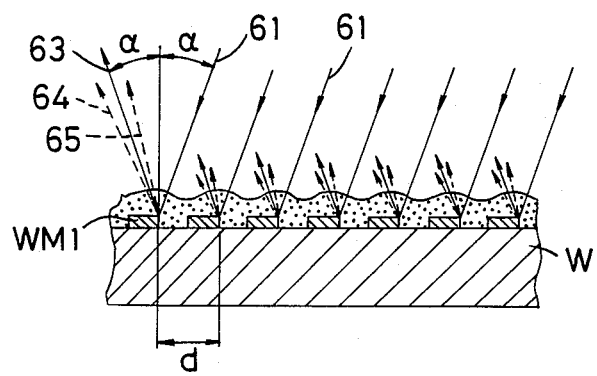
FIG. 3A is a view showing the mode of diffraction from the alignment mark on the wafer.
Figure 3B:
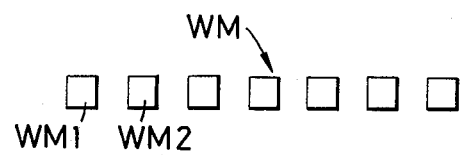
FIG. 3B is a plan view of the alignment marks on the wafer.

FIG. 3A shows the mode of diffraction of the aligning light by the wafer alignment mark, and FIG. 3B shows a plan view of the wafer alignment mark. The wafer alignment mark is composed of a regular array, with a pitch d, of small rectangular patterns WM1, WM2, ..., which generates, in response to an aligning laser beam 61 entering with an incident angle α, diffracted light beams 64, 65 in addition to the normal reflected light 63 of an exit angle α.

The measurement of the alignment position in the x-direction is achieved by moving the wafer stage ST in the x-direction in such a manner that either or both of the paired mark WMX are scanned by the laser light spot WSX of the x-direction.

The measurement in the y-direction is achieved also by moving the wafer stage ST to scan the marks WMY with the laser light spot WS for the y-direction.

Figure 7:
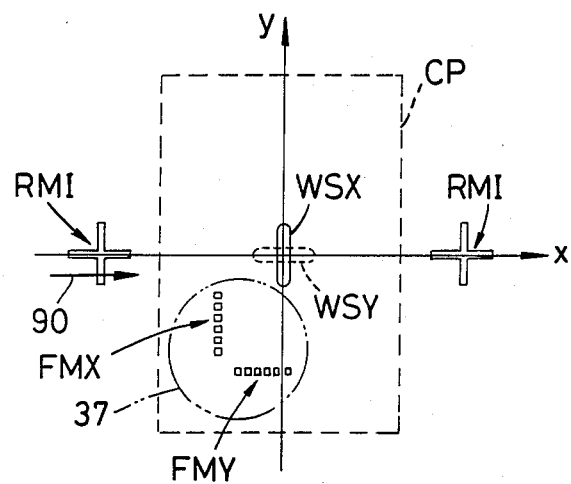
FIG. 7 is a view showing the mark positions at the baseline measurement.

FIG. 7 shows patterns RMI conjugate with the reticle marks RM, in the area of projected image on the wafer. The fiducial mark on the mark plate 37 is composed of a mark FMX in the x-direction and a mark FMY in the y-direction, formed as diffraction gratings. These marks FMX, FMY are formed substantially same as the wafer alignment marks WM, and the grating elements of the diffraction grating are formed as translucent patterns in opaque background. The positional relationship between the images RMI of the reticle marks and the laser spots WSX, WSY is measured by means of the fiducial marks FMX, FMY.

For example, for measuring the position in the x-direction of the image RMI of the reticle mark, there is employed a portion, extended in the y-direction, of the image of the mark. The switching mirror 3 is placed at the solid-lined position, and the wafer stage ST is moved. When the fiducial mark FMX overlaps with the image RMI of the reticle mark, the light from said fiducial mark passes the reticle mark RM from bottom side and reaches the detector 28. The position of the image RMI of the reticle mark is determined from the output of the detector 28 and the measured value of the laser interferometer 41. The marks FMX, FMY emit light in pulses by the illumination from the laser light source, so that the photoelectric converted output of the detector 28 shows a form shown in FIG. 6B, wherein the abscissa indicates the x-measured value of the interferometer while the ordinate indicates the output of the detector 28. The light emission from the fiducial marks FMX, FMY, triggered by the laser light source 1, is conducted in response to a count pulse released from the laser interferometer 41 for each unit movement, for example 0.01 μm.

The position in the x-direction of the image RMI of the reticle mark can be determined by obtaining the central position XRX of the envelope 77 of the obtained photoelectric signal at a predetermined level 78. The baseline in the x-direction can be measured from thus measured position and the center XWX of the mark FMX measured with the laser light spot WSX. Similarly, for the measurement of the baseline in the y-direction, there is employed a portion, exteded in the x-direction, of the image RMI of the reticle mark, and the fiducial mark FMY of the mark plate 37.

FIG. 5 shows the mode of scanning of the image RMI of the reticle by the mark FMX as indicated by an arrow 90 shown in FIG. 7.

FIG. 6A shows the photoelectric signal 71 corresponding to the diffracted light received by the detector 16 when the mark FMX passes through the laser light spot WSX, and the corresponding detecting position XWX. If the width of the laser light spot WSX is selected approximately equal to that of the mark FMX, the wave form 71 becomes substantially Gaussion. The target aligning position for exposure is determined from these positions XRX, XWX, design positions of the reticle marks RMI, design positions of the wafer alignment marks, and actual calculated positions of the alignment marks.

In the measurement of the reticle mark images RMI in the y-direction, the positions of said images do not meet the Abbe's principle with respect to the measurement of the laser interferometer. It is therefore preferable to effect the yawing measurement for the wafer stage ST and to compensate the positional error resulting from the yawing. For this purpose there is required another laser interferometer for yawing measurement, in addition in the laser interferometer 41. The rotational error of the reticle can also be measured by the measurement of the two images of the reticle marks.

In illuminating the reticle marks RM from the side of the projection optical system L1, L2 by means of the light coming from the fiducial mark of the mark plate 37, the light for illuminating the fiducial mark is supplied from the pulsed laser 1. In ordinary excimer laser, the envelope 78 of the photoelectric signal cannot be determined exactly from the detecting method shown in FIG. 6B, because of a fluctuation in the amount of light in the order of several per cent among pulses. For this reason, a part of the pulsed laser light is extracted by the beam splitter 30 shown in FIG. 1 and is received by a detector 32 through a condenser lens 31. Thus the intensity of the alignment signal (output signal 55 from the detector 28) obtained for each pulse can be normalized based on the output signal 53 of the detector 32. This operation is conducted by a control system 40, which receives the output signal 54 from the detector 24 at the reticle alignment, and positions the reticle R through a driving system 6, based on said signal. Also the control system 40 receives and releases information 51 for exposure control and alignment information 52 detected from the laser light spot WS through the detector 16.

Figure 8:
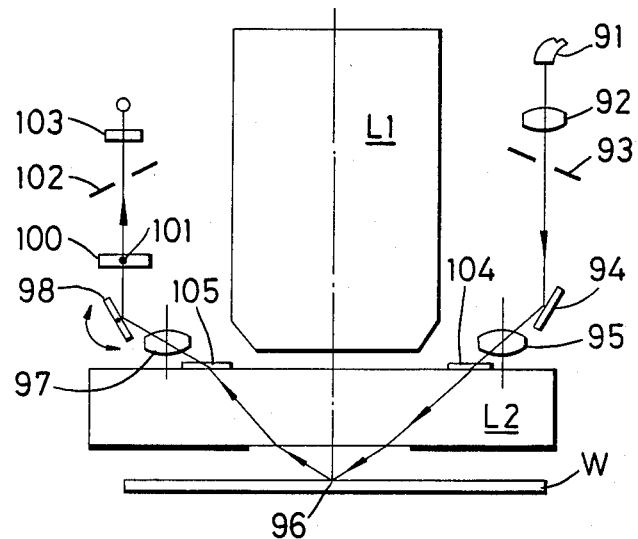
FIG. 8 is an optical view showing an example of an automatic focus detecting system.

FIG. 8 shows an example of automatic focus detecting system adapted for use in the present embodiment, wherein a light beam is introduced obliquely to the surface of the wafer W and the positional displacement of the reflected image is measured, as disclosed in the U.S. Pat. No. 4,650,983. Said automatic focus detecting system is provided at a position of 45° around the optical axis AX, with respect to the alignment system 10-12, 14-16 shown in FIG. 1.

Light of a non-exposing wavelength is emitted from a fiber 91 and illuminates a slit plate 93 through a condenser lens 92. The light transmitted by the slit, extending perpendicularly to the plane of drawing, of the slit plate 93 is reflected by a mirror 94, and is focused as a slit image 96 on the wafer W through a focusing lens system 95. The optical axis of said lens system 95 may be inclined, but is preferably parallel to the optical axis of the projection lens 1 in terms of correction of aberrations. The light emerging from said lens system 95 enters, through a filter layer 104 for eliminating the light component of the first wavelength, obliquely the optical member L2, and is emitted from the the lower face thereof again obliquely toward the center of the field of the projection lens. The light reflected from the wafer W is guided, again through the optical member L2 and a filter layer 105 for cutting off the light component of the first wavelength, to a condensing lens system 97, further guided through a vibrating mirror 98 which vibrates about an axis perpendicular to the plane of drawing and a flat glass plate 100 with parallel surfaces rotatable about a shaft 101 perpendicular to the plane of drawing, and reaches a slit plate 102, thus forming a reflected image of the slit image 96 thereon. The slit plate 102 is provided with a slit extending perpendicularly to the plane of drawing, and the light transmitted therethrough is guided to a photoelectric detector 103, of which output signal is processed by synchronized detection to determine the position of the wafer W in the axial direction.

In the above-explained embodiment, the wafer alignment marks are detected by the diffracted light from grating patterns, but it is also possible to employ other methods, such as method with double diffraction gratings disclosed in the U.S. Pat. No. 4,710,026 for measuring the coincidence of an alignment mark (diffraction grating) on the wafer and a fixed mark (diffraction grating) on the apparatus, or a method of comparing an image of the wafer alignment mark formed through an optical microscope with a reference formed on the apparatus. Also the mark can be composed of a simple bar mark or a linear edge.

The laser light spots WSX, WSY are positioned at the center of the projection exposure area in order to minimize the detection error of the positions of the alignment marks, but they need not necessarily be positioned as such, if the time for measuring the positions of the alignment marks is to be minimized. For such purpose, though the Abbe's principle may not be satisfied, the laser light spot WSX for the x-direction may be formed in a position on the y-axis but apart from the x-axis and the laser light spot WSY for the y-direction may be formed in a position on the x-axis but apart from the y-axis to increase the measuring speed, while maintaining the symmetry of the laser light spot, particularly symmetry in the direction of width of the light spots WS and improving the symmetry in the detection of the wafer alignment marks.

Also the photoelectric signal (mark detection signal) obtained form the wafer through the wafer alignment mark detecting system can be processed to enable detection of the focused state, and can therefore be utilized for automatic focusing. Consequently, there can be achieved focus detection equivalent to that in the oblique light focus detecting system shown in FIG. 8. The wafer levelling (inclination of the wafer surface with respect to the image plane) can also be determined by measuring three or more points in the periphery of the exposure area by means of such automatic focus detecting system.

In addition to the optical detecting system, there may also be employed a gap sensor employing an air micrometer composed of a detecting nozzle provided on the optical member L2, or a capacitance sensor utilizing the reflective layer 133, formed on the lower surface of said optical member L2, as an electrode. In the above-explained embodiment the lowermost optical member is formed as a flat plate, but it may be composed of an optical lens having a curved surface, or it may be composed of a combination of optical parts. However, a flat plate member has an advantage of positional reproducibility at the replacement when the lower part of the member L2 is smeared with the photoresist scattered or evaporated by the excimer laser light. Also the optical member L2 may be formed horrow at the center, whereby the projection lens L1 alone contributes to the projection of the patterns of the reticle R onto the wafer W.

What is claimed is:

1. A projection exposure apparatus comprising:
   a projection optical system for projecting the image of an object on a first plane onto a work piece on a second plane:
   first radiation means for emitting the light of a first wavelength for illuminating said object;
   an optical member positioned between said projection optical system and said second plane, and having a portion transmitting the light of said first wavelength emitted from said projection optical system toward said second plane;
   second radiation means for emitting the light of a second wavelength, different from said first wavelength, obliquely to said second plane through said optical member; and
   detector means for receiving the light of said second wavelength, which is obliquely emitted from the work piece on said second plane and passes through said optical member.

2. A projection exposure apparatus according to claim 1, wherein said optical member is provided with a light control layer showing mutually different reflection and transmission characteristics for said lights of first and second wavelengths.

3. A projection exposure apparatus according to claim 1, wherein said optical member is positioned across the optical axis of said projection optical system.

4. A projection exposure apparatus according to claim 1, wherein said second radiation means is adapted to emit the light of said second wavelength from a position between said projection optical system and said second plane into said optical member.

5. A projection exposure apparatus according to claim 4, wherein said second radiation means is adapted to form a light spot of said second wavelength in the field of said projection optical system on said second plane.

6. A projection exposure apparatus according to claim 1, wherein said optical member comprises a flat plate with parallel surfaces positioned perpendicular to the optical axis of said projection optical system.

* * * * *